(12) United States Patent
Machimura et al.

(10) Patent No.: US 11,067,598 B2
(45) Date of Patent: Jul. 20, 2021

(54) INSPECTION DATA OUTPUT DEVICE, DISPLAY SYSTEM, AND INSPECTION DATA OUTPUT METHOD

(71) Applicant: DENSO TEN Limited, Kobe (JP)

(72) Inventors: Sakatoshi Machimura, Kobe (JP); Takuya Hibino, Kobe (JP); Hikoichi Yonetani, Kobe (JP); Tatsuya Takaoka, Kobe (JP); Soichiro Yamamoto, Kobe (JP)

(73) Assignee: DENSO TEN Limited, Kobe (JP)

( * ) Notice: Subject to any disclaimer, the term of this patent is extended or adjusted under 35 U.S.C. 154(b) by 0 days.

(21) Appl. No.: 16/709,398

(22) Filed: Dec. 10, 2019

(65) Prior Publication Data

US 2020/0309817 A1   Oct. 1, 2020

(30) Foreign Application Priority Data

Mar. 28, 2019   (JP) .............................. JP2019-064658

(51) Int. Cl.
*G06T 11/00* (2006.01)
*G01R 1/02* (2006.01)
*G01R 31/28* (2006.01)

(52) U.S. Cl.
CPC .......... *G01R 1/025* (2013.01); *G01R 31/2803* (2013.01); *G06T 11/00* (2013.01)

(58) Field of Classification Search
CPC ..................................................... G01R 1/025
USPC ......................................................... 345/633
See application file for complete search history.

(56) References Cited

U.S. PATENT DOCUMENTS

| 4,727,530 A | * | 2/1988 | Tomisawa | ............... | G11B 19/28 369/111 |
| 5,596,585 A | * | 1/1997 | Njinda | ........... | G01R 31/318586 714/733 |
| 6,606,731 B1 | * | 8/2003 | Baum | ................ | G06K 9/00476 716/103 |
| 2006/0123692 A1 | * | 6/2006 | Beronja | ............... | G07C 5/0808 43/61 |
| 2006/0282796 A1 | * | 12/2006 | Nuno | ..................... | G06Q 10/06 715/853 |
| 2007/0032207 A1 | * | 2/2007 | Shah | ................... | B60R 16/0215 455/111 |
| 2007/0168172 A1 | * | 7/2007 | Hong | ..................... | G06F 30/367 703/14 |
| 2007/0300198 A1 | * | 12/2007 | Chaplin | .................. | G06F 30/15 716/122 |
| 2010/0245389 A1 | * | 9/2010 | Aoki | .................. | G01R 13/0245 345/641 |

(Continued)

FOREIGN PATENT DOCUMENTS

JP   2009-217779 A   9/2009

*Primary Examiner* — Javid A Amini
(74) *Attorney, Agent, or Firm* — Oliff PLC

(57) ABSTRACT

An inspection data output device according to an embodiment includes an input unit, a generation unit, and an output unit. Information on a portion to be inspected in a circuit board is supplied to the input unit. The generation unit generates emphasis data in which an output signal path being a signal path on the circuit board and being a signal path capable of detecting an output signal of the portion to be inspected is emphasized more than another signal path. The output unit outputs the emphasis data to a display device.

10 Claims, 6 Drawing Sheets

(56) References Cited

U.S. PATENT DOCUMENTS

| | | | |
|---|---|---|---|
| 2011/0035721 A1* | 2/2011 | Shimoyama | G06T 11/206 716/139 |
| 2012/0262333 A1* | 10/2012 | Trummer | H05H 7/22 342/146 |
| 2018/0024837 A1* | 1/2018 | Sadowski | G06F 9/3836 712/226 |
| 2018/0096088 A1* | 4/2018 | Itakura | G06F 30/367 |
| 2018/0276470 A1* | 9/2018 | Diegmann | G06K 7/1413 |

* cited by examiner

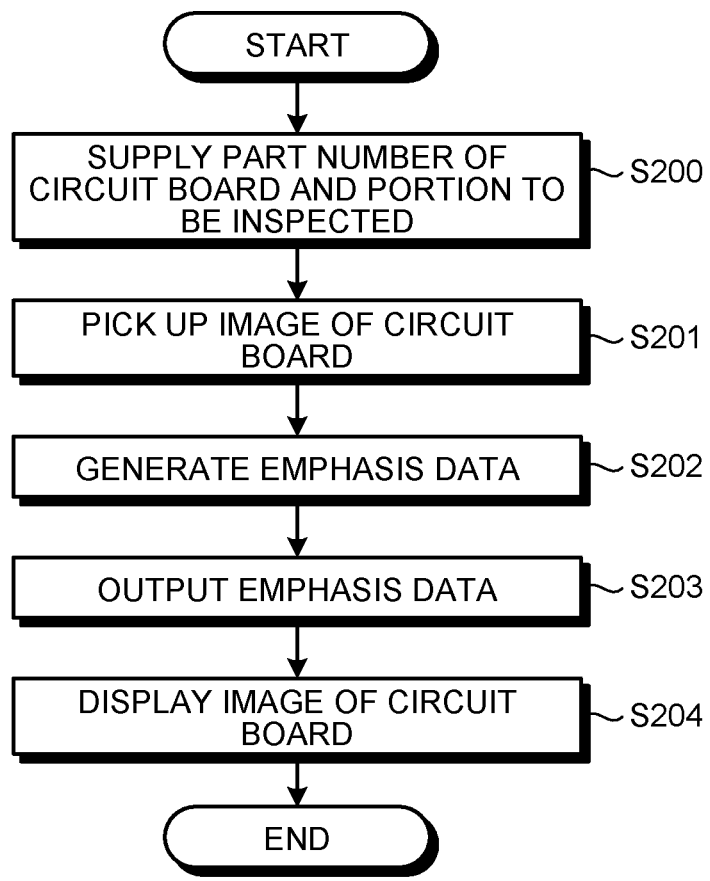

US 11,067,598 B2

INSPECTION DATA OUTPUT DEVICE, DISPLAY SYSTEM, AND INSPECTION DATA OUTPUT METHOD

CROSS-REFERENCE TO RELATED APPLICATION

This application is based upon and claims the benefit of priority of the prior Japanese Patent Application No. 2019-064658, filed on Mar. 28, 2019, the entire contents of which are incorporated herein by reference.

FIELD

The embodiments discussed herein are directed to an inspection data output device, a display system, and an inspection data output method.

BACKGROUND

Conventionally, a display device that, when a component in a wiring diagram of a circuit board displayed on a display apparatus is selected, highlights the selected component and a wiring extending from the selected component on the wiring diagram has been known (for example, see Japanese Laid-open Patent Publication No. 2009-217779).

In the display device described above, to inspect an output signal of a portion to be inspected in the circuit board, an inspection work is performed by probing the portion to be inspected, while comparing between the wiring diagram and the actual circuit board.

However, the shapes and signal paths of the wiring diagram and the actual circuit board are not matched, and the worker may misread the position of the portion to be inspected in the actual circuit board, with respect to the highlighted wiring diagram. In other words, the output signal of the portion to be inspected may not be accurately measured.

SUMMARY

An inspection data output device according to an embodiment includes an input unit, a generation unit, and an output unit. Information on a portion to be inspected in a circuit board is supplied to the input unit. The generation unit generates emphasis data in which an output signal path being a signal path on the circuit board and being a signal path capable of detecting an output signal of the portion to be inspected is emphasized more than another signal path. The output unit outputs the emphasis data to a display device.

BRIEF DESCRIPTION OF DRAWINGS

FIG. 6 is a flowchart for explaining an emphasizing process according to the third embodiment.

DESCRIPTION OF EMBODIMENTS

Hereinafter, an inspection data output device, a display system, and an inspection data output method according to embodiments will be described in detail with reference to the accompanying drawings. However, the present invention is not limited to the embodiments.

First Embodiment

In a circuit board such as an electronic control unit (ECU) and the like, for example, inspection is performed to determine whether an output signal is normally output from an electronic component. Such inspection is performed by probing a portion to be inspected.

In general, to inspect an output signal of a portion to be inspected, a worker specifies the portion to be inspected on the basis of a circuit diagram of a substrate, a layout of electronic components, and an assignment list. The worker then measures the output signal of the portion to be inspected, by probing the specified portion.

For example, to measure an output signal of a certain pin in an electronic component including a large number of pins, the worker needs to specify a pin which is to be the portion to be inspected, among the large number of pins. Consequently, the worker may misread the position of the pin which is the portion to be inspected.

Moreover, when the circuit board is a ball grid array (BGA), it is not possible to directly probe the pin in the electronic component. In this case, the output signal of the portion to be inspected is measured, by probing a signal path (wiring pattern) of a circuit that is electrically connected to the portion to be inspected.

However, in this case, the worker needs to specify the signal path of the portion to be inspected that is electrically connected to the portion to be inspected and that can be probed, on the basis of the circuit diagram of the substrate, the layout of electronic components, and the like. Thus, the worker may misread the signal path of the portion to be inspected. Moreover, the worker may similarly misread the signal path of the object to be inspected, in a circuit board provided with a large number of electronic components, and a circuit board formed with a large number of signal paths.

In other words, in the conventional method, the measurement work of the output signal of the portion to be inspected becomes complicated, and the output signal of the portion to be inspected may not be accurately measured.

Figure 1:
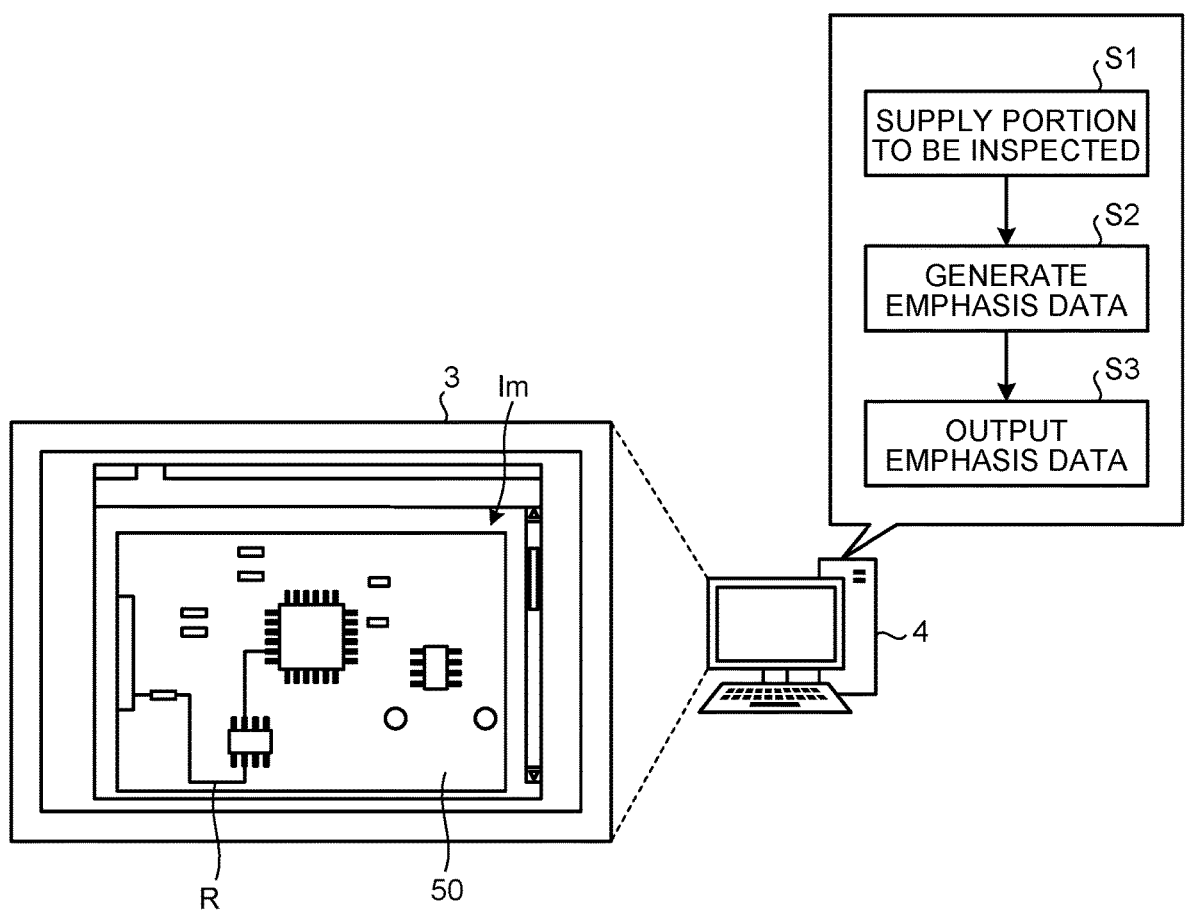
FIG. 1 is a diagram illustrating an outline of an inspection data output method according to a first embodiment.

An outline of an inspection data output method according to a first embodiment will now be described with reference to FIG. 1. FIG. 1 is a diagram illustrating an outline of an inspection data output method according to the first embodiment. The inspection data output method according to the first embodiment is executed by an inspection data output device 4.

When a portion to be inspected is supplied (S1), the inspection data output device 4 generates emphasis data (S2).

The emphasis data is data in which an output signal path R that is a signal path on a circuit board 50, and that is a signal path capable of detecting an output signal of the portion to be inspected is emphasized, more than the other signal path. The output signal path R emphasized by the emphasis data is a signal path in the layout diagram of the circuit board 50, a signal path in computer-aided design (CAD) data of the circuit board 50, and a signal path of the actual circuit board 50. In other words, the output signal path R emphasized by the emphasis data is a signal path the position and shape of which are matched with those of the signal path of the actual circuit board 50. In other words, the "signal path on the circuit board 50" described above is a signal path the position and shape of which are substantially matched with those of the signal path of the actual circuit board 50.

The inspection data output device 4 generates a model of the circuit board 50 on the basis of the CAD data of the circuit board 50, the circuit diagram of the circuit board 50, the layout of electronic components, the assignment list of a connector, and the like. The inspection data output device 4 generates a model of the circuit board 50 that has electric connection information of the parts of the CAD data, by linking information on the signal path, the electronic component, and the connector, with the parts of the CAD data of the circuit board 50.

More specifically, the inspection data output device 4 generates a three-dimensional model of the circuit board 50. The inspection data output device 4 may also generate a two-dimensional model of the circuit board 50.

The inspection data output device 4 generates emphasis data in which the output signal path R is emphasized with respect to the three-dimensional model of the circuit board 50.

More specifically, in the three-dimensional model of the circuit board 50, the inspection data output device 4 generates emphasis data in which the electronic components and the output signal path R in the circuit board 50 are displayed, and the other signal path is not displayed.

In the three-dimensional model of the circuit board 50, the inspection data output device 4 may also generate emphasis data in which the type of the output signal path R and the type of the other signal path are different from each other. For example, the inspection data output device 4 may generate emphasis data with different line type, line color, and line thickness for the output signal path R and the other signal path.

The inspection data output device 4 outputs the generated emphasis data to a display device 3 (S3). In this manner, an image Im in which the output signal path R of the portion to be inspected is emphasized in the three-dimensional model of the circuit board 50 is displayed on the display device 3.

Thus, the worker may inspect the output signal of the actual circuit board 50, on the basis of the output signal path R of the portion to be inspected that is emphasized in the three-dimensional model of the circuit board 50 displayed on the display device 3, easily specifying the portion where the output signal of the portion to be inspected can be detected. Thus, the worker can easily perform the measurement work, and can accurately measure the output signal of the portion to be inspected.

Figure 2:
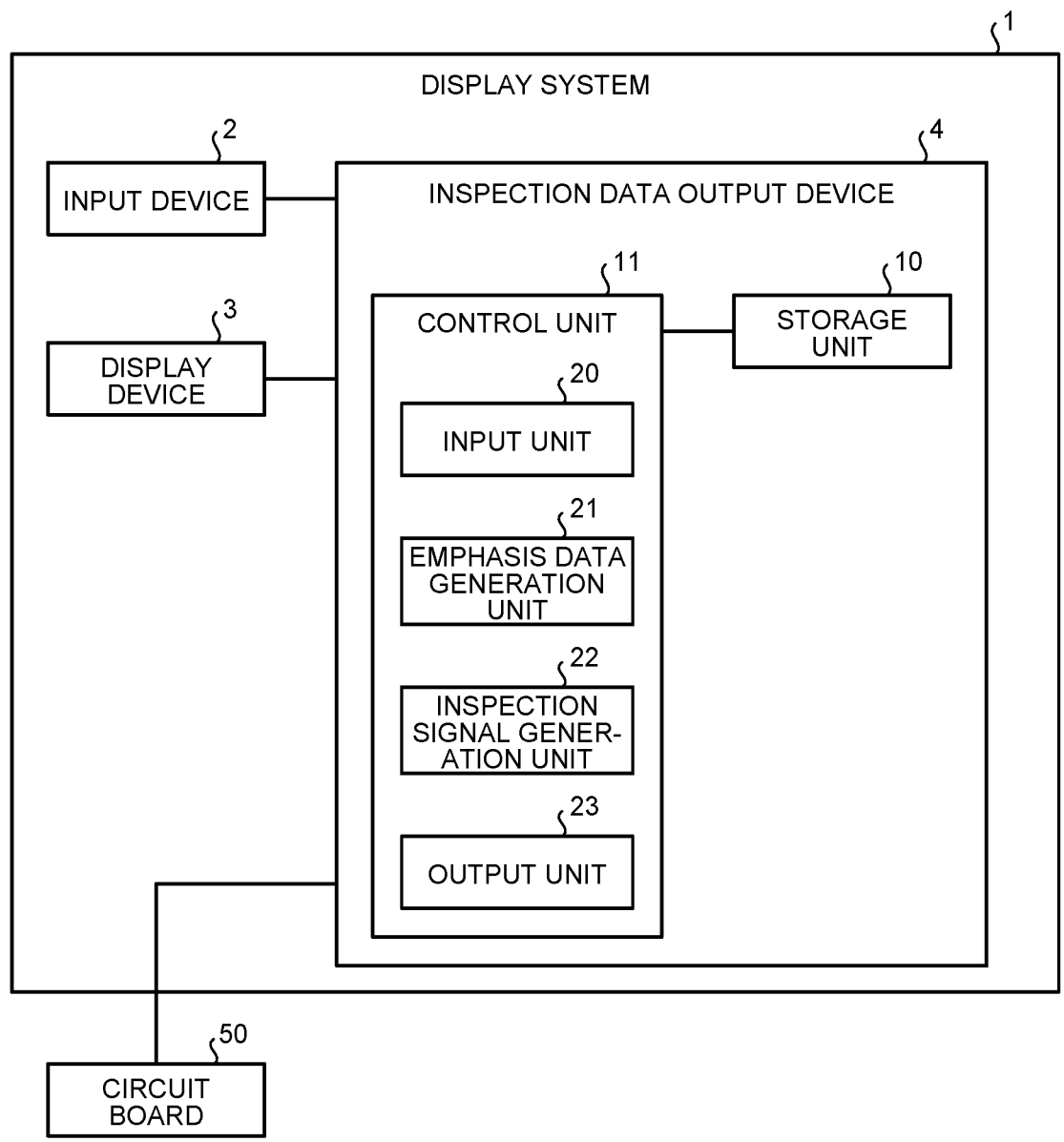
FIG. 2 is a block diagram illustrating a schematic configuration of a display system according to the first embodiment.

Next, a display system 1 according to the first embodiment will be described with reference to FIG. 2. FIG. 2 is a block diagram illustrating a schematic configuration of the display system 1 according to the first embodiment.

The display system 1 includes an input device 2, the display device 3, and the inspection data output device 4. The input device 2, the display device 3, and the inspection data output device 4 may be configured by a plurality of devices. Alternatively, the input device 2, the display device 3, and the inspection data output device 4 may be configured as an integral device. For example, the input device 2 and the display device 3 may be integrally configured.

The input device 2 is a device used to input the part number of the circuit board 50 and the portion to be inspected. For example, the input device 2 is a keyboard, a mouse, a voice input device, and a touch panel. The input device 2 may also be an image recognition device.

For example, the display device 3 is a display, a tablet terminal, a smartphone, a personal digital assistant (PDA), and a head mount device. On the basis of the emphasis data output from the inspection data output device 4, the display device 3 displays the image Im of the circuit board 50 in which the output signal path R of the portion to be inspected is emphasized.

The inspection data output device 4 includes a storage unit 10 and a control unit 11. The inspection data output device 4 generates emphasis data, and causes the display device 3 to display the generated emphasis data. For example, the inspection data output device 4 may be a personal computer (PC), a tablet terminal, and a personal digital assistant (PDA). Note that the inspection data output device 4 may be a cloud server.

The storage unit 10 is implemented by a semiconductor memory device such as a random access memory (RAM) and a flash memory, or a storage device such as a hard disk and an optical disc.

The storage unit 10 stores therein the CAD data of the circuit board 50; the circuit diagram of the circuit board 50; the layout of electronic components such as a central processing unit (CPU), a resistor, and an integrated circuit (IC) of the circuit board 50; and the assignment list of the connector. The circuit diagram and the like are stored in the storage unit 10, by being linked to each part number of the circuit board 50. Moreover, the generated three-dimensional model of the circuit board 50 is stored in the storage unit 10.

The control unit 11 is a controller. For example, the control unit 11 is implemented when various programs stored in the storage device inside the storage unit 10 are executed by the CPU, a micro processing unit (MPU), or the like, while using the RAM as a working area.

For example, the control unit 11 may be implemented by an integrated circuit such as an application specific integrated circuit (ASIC) and a field programmable gate array (FPGA).

The control unit 11 includes an input unit 20, an emphasis data generation unit 21 (generation unit), an inspection signal generation unit 22, and an output unit 23. The input unit 20, the emphasis data generation unit 21, the inspection signal generation unit 22, and the output unit 23 may be integrated with each other, or may be divided into a plurality of units. In this example, the control unit 11 includes the inspection signal generation unit 22. However, the control unit 11 does not necessarily include the inspection signal generation unit 22.

Information such as the part number of the circuit board 50 and the portion to be inspected is supplied to the input unit 20 from the input device 2. Information such as the circuit diagram of the circuit board 50 and the electronic components of the circuit board 50 is supplied to the input unit 20. The information such as the circuit diagram of the circuit board 50 may be supplied to the input unit 20 from the other external device via a network.

On the basis of the information such as the part number of the circuit board 50 and the portion to be inspected that has been input, the emphasis data generation unit 21 generates the emphasis data of the circuit board 50. The emphasis data generation unit 21 generates the three-dimensional model of the circuit board 50, and generates the emphasis data in which the output signal path R of the portion to be inspected in the generated three-dimensional model is emphasized, more than the other signal path.

More specifically, on the basis of the information such as the CAD data of the circuit board 50, the circuit diagram of the circuit board 50, and the layout of electronic components, the emphasis data generation unit 21 generates the three-dimensional model of the circuit board 50 at a predetermined timing. For example, the predetermined timing is timing when information such as the CAD data of the circuit board 50, the circuit diagram of the circuit board 50, the layout of electronic components, and the like is supplied.

In other words, the emphasis data generation unit 21 generates the three-dimensional model of the circuit board 50, before the information on the portion to be inspected is supplied to the input unit 20. The generated three-dimensional model is stored in the storage unit 10 by being linked to the part number of the circuit board 50. In this manner, when the portion to be inspected is supplied, the emphasis data can be generated in a short period of time.

Moreover, the emphasis data generation unit 21 may also generate the three-dimensional model of the circuit board 50, at the timing when the information such as the part number of the circuit board 50 and the portion to be inspected is supplied. For example, the emphasis data generation unit 21 may also generate the three-dimensional model, when the portion to be inspected is supplied for the first time, with respect to the circuit board 50 having a certain part number.

The emphasis data generation unit 21 may also generate the three-dimensional model of the circuit board 50, every time information such as the part number of the circuit board 50 and the portion to be inspected is supplied to the input unit 20. In this manner, it is possible to reduce the volume of data stored in the storage unit 10.

The emphasis data generation unit 21 generates the emphasis data in which the output signal path R of the portion to be inspected is emphasized with respect to the three-dimensional model of the circuit board 50. More specifically, the emphasis data generation unit 21 generates the emphasis data in which only the output signal path R of the portion to be inspected is displayed.

For the circuit board 50 in which the signal path is formed on both sides, the emphasis data generation unit 21 generates the emphasis data with different type of the output signal path R for each surface. For example, the emphasis data generation unit 21 generates the emphasis data in which the output signal path R of the portion to be inspected at the front surface side is displayed by the solid line, and the output signal path R of the portion to be inspected at the rear surface side is displayed by the broken line. The emphasis data generation unit 21 may also generate the emphasis data in which the electronic components at the rear surface side, or the electronic components relating to the output signal path R among the electronic components at the rear surface side are displayed by the broken line.

The front surface is a surface displayed on the display device 3, and the rear surface is a surface of the circuit board 50 placed at the rear side, with respect to the surface of the circuit board 50 displayed on the display device 3.

The inspection signal generation unit 22 generates an inspection signal for the portion to be inspected. The inspection signal generation unit 22 generates a waveform inspection signal according to the portion to be inspected.

The output unit 23 outputs the emphasis data generated by the emphasis data generation unit 21 to the display device 3.

In this manner, the image Im of the emphasis data is displayed on the display device 3.

Moreover, the output unit 23 outputs the inspection signal generated by the inspection signal generation unit 22 to the circuit board 50.

Figure 3A:
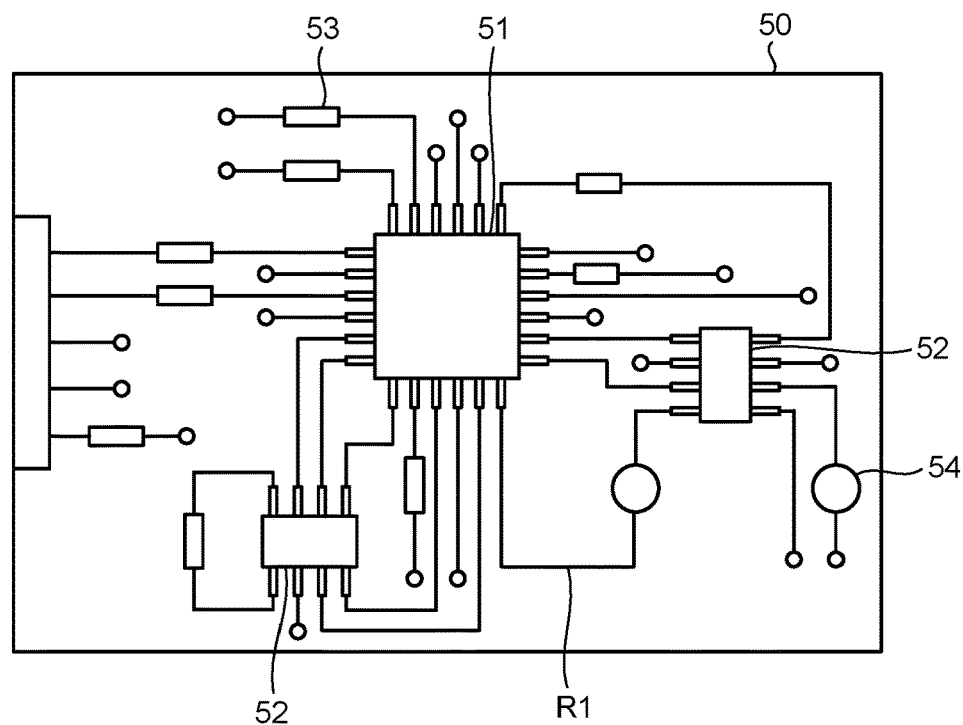
FIG. 3A is a diagram illustrating an actual circuit board.
Figure 3B:
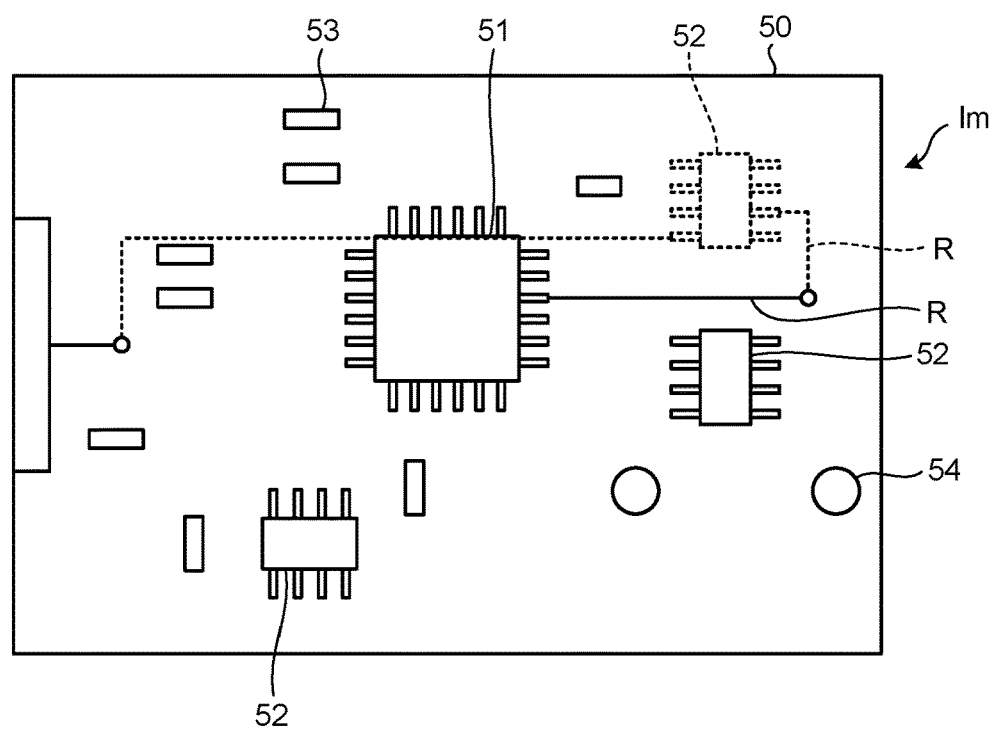
FIG. 3B is a diagram illustrating an image of a circuit board in which an output signal path of a portion to be inspected is emphasized.

The image Im of the circuit board 50 to be displayed on the display device 3 will now be described with reference to FIG. 3A and FIG. 3B. FIG. 3A is a diagram illustrating the actual circuit board 50. FIG. 3B is a diagram illustrating the image Im of the circuit board 50 in which the output signal path R of a portion to be inspected is emphasized. In FIG. 3B, only the circuit board 50 is illustrated. In this example, the signal path is formed on both sides of the circuit board 50.

Electronic components such as a CPU 51, an integrated circuit (IC) 52, a resistor 53, and a capacitor 54 are electrically connected to the circuit board 50 via a signal path R1. In FIG. 3A, reference numerals denote a part of the electronic components and signal paths.

In the image Im of the circuit board 50 in which the output signal path R of the portion to be inspected is emphasized, only the electronic components of the circuit board 50 and the output signal path R of the portion to be inspected are displayed. More specifically, the electronic components at the front surface side, and the output signal path R of the portion to be inspected are displayed by the solid line. Among the electronic components at the rear surface side, the electronic components relating to the output signal path R of the portion to be inspected, and the output signal path R of the portion to be inspected at the rear surface side are displayed by the broken line, for example.

As described above, in the image Im of the circuit board 50 in which the output signal path R of the portion to be inspected is emphasized, the only signal path displayed on the three-dimensional model of the circuit board 50 is the output signal path R. Consequently, the output signal path R can be easily specified.

Figure 4:
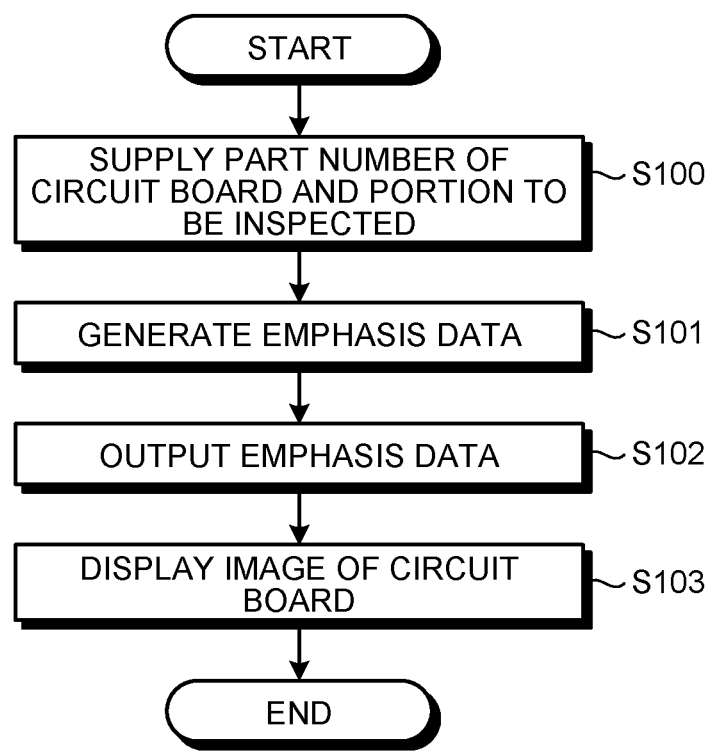
FIG. 4 is a flowchart for explaining an emphasizing process according to the first embodiment.

Next, the emphasizing process according to the first embodiment will now be described with reference to FIG. 4. FIG. 4 is a flowchart for explaining the emphasizing process according to the first embodiment.

In the display system 1, when the part number of the circuit board 50 and the portion to be inspected are supplied to the input unit 20 via the input device 2 (S100), the inspection data output device 4 generates emphasis data (S101).

In the display system 1, the emphasis data generated by the inspection data output device 4 is output to the display device 3 (S102). In the display system 1, the display device 3 then displays the image Im of the circuit board 50 in which the output signal path R of the portion to be inspected is emphasized (S103).

The inspection data output device 4 generates the emphasis data in which the output signal path R of the portion to be inspected is emphasized more than the other signal path, and outputs the generated emphasis data to the display device 3. More specifically, the inspection data output device 4 generates the emphasis data in which the output signal path R of the portion to be inspected is emphasized in the three-dimensional model of the circuit board 50 that is to be displayed on the display device 3. The inspection data output device 4 then outputs the generated emphasis data to the display device 3.

In this manner, the worker may inspect the output signal of the actual circuit board 50, on the basis of the output signal path R of the portion to be inspected that is highlighted in the three-dimensional model of the circuit board 50 displayed on the display device 3. Thus, the worker can easily specify the portion where the output signal of the portion to be inspected can be detected. Thus, the worker can easily perform the measurement work, and can accurately measure the output signal of the portion to be inspected.

Moreover, in the three-dimensional model of the circuit board 50 displayed on the display device 3, the inspection data output device 4 generates the emphasis data in which only the output signal path R of the portion to be inspected is displayed, among a plurality of the signal paths in the circuit board 50.

In this manner, the worker can easily specify the portion where the output signal of the portion to be inspected can be detected. Thus, the worker can easily perform the measurement work, and can accurately measure the output signal of the portion to be inspected.

Furthermore, with respect to the circuit board 50 in which the signal path (wiring pattern) is formed on both sides, the inspection data output device 4 generates the emphasis data with different type of the output signal path R for each surface.

In this manner, even in the circuit board 50 in which the signal path is formed on both sides, the worker can easily specify the portion where the output signal of the portion to be inspected can be detected.

Second Embodiment

The display system 1 according to a second embodiment will be described. In this example, portions different from those in the display system 1 according to the first embodiment will be mainly described, and explanation of configurations and processes identical to those in the display system 1 according to the first embodiment will be omitted.

In the display system 1 according to the second embodiment, the image Im based on the emphasis data is projected on the actual circuit board 50 by using a projection mapping.

The emphasis data generation unit 21 of the inspection data output device 4 generates emphasis data, on the basis of information such as the CAD data of the circuit board 50, the circuit diagram of the circuit board 50, the layout of electronic components, and a predetermined position of a mounting table. The emphasis data is data of an image in which the output signal path R of the portion to be inspected is emphasized, and an image to be projected on the circuit board 50.

The output unit 23 outputs the emphasis data generated by the emphasis data generation unit 21 to the display device 3.

The display device 3 is a projector. With respect to the circuit board 50 mounted on a mounting table, the display device 3 projects the image Im of the output signal path R of the portion to be inspected, on the basis of the emphasis data. More specifically, the display device 3 projects the image Im of the output signal path R of the portion to be inspected on the basis of the emphasis data in an overlapping manner, on the output signal path R of the portion to be inspected in the actual circuit board 50.

As described above, the inspection data output device 4 generates the emphasis data of the image Im in which the output signal path R of the portion to be inspected is emphasized, to be projected on the actual circuit board 50.

In this manner, the worker can easily specify the portion where the output signal of the portion to be inspected can be detected, on the basis of the image Im projected on the actual circuit board 50. Thus, the worker can easily perform the measurement work, and can accurately measure the output signal of the portion to be inspected.

Third Embodiment

Figure 5:
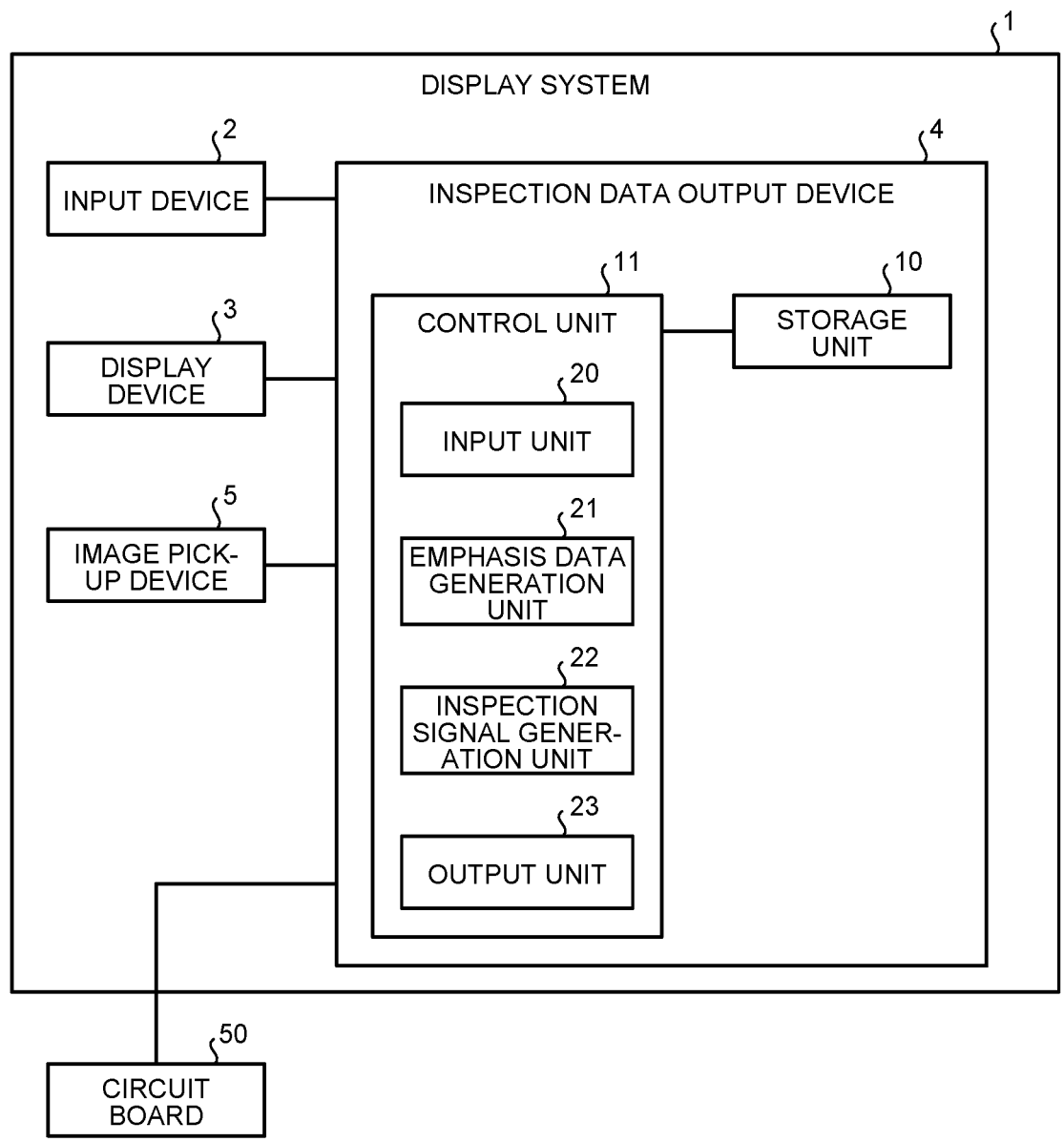
FIG. 5 is a block diagram illustrating a schematic configuration of a display system according to a third embodiment.

The display system 1 according to a third embodiment will now be described with reference to FIG. 5. In this example, portions different from those in the display system 1 according to the first embodiment will be mainly described, and explanation of configurations and processes identical to those in the display system 1 according to the first embodiment will be omitted. FIG. 5 is a block diagram illustrating a schematic configuration of the display system 1 according to the third embodiment.

In the display system 1 according to the third embodiment, the display device 3 displays the image Im in augmented reality in which the output signal path R of the portion to be inspected is emphasized.

The display system 1 includes the input device 2, the display device 3, an image pick-up device 5, and the inspection data output device 4.

The image pick-up device 5 is a camera that includes an image sensor such as a charge coupled device (CCD) and a complementary metal oxide semiconductor (CMOS). For example, the image pick-up device 5 is a camera installed on tablet terminals and smart phones. The image pick-up device 5 may be integrally configured with the display device 3. The image pick-up device 5 picks up an image of the circuit board 50. The data on the circuit board 50 acquired by the image pick-up device 5 is supplied to the input unit 20.

The emphasis data generation unit 21 of the inspection data output device 4 generates data on an image in which the output signal path R of the portion to be inspected is emphasized with respect to the circuit board 50, on the basis of information such as the CAD data of the circuit board 50, the circuit diagram of the circuit board 50, the layout of electronic components, and the portion to be inspected. The emphasis data generation unit 21 then generates the data on the image Im in augmented reality that is obtained by overlapping the image in which the output signal path R of the portion to be inspected is emphasized, on an image of the circuit board 50, as emphasis data.

The output unit 23 outputs the emphasis data generated by the emphasis data generation unit 21 to the display device 3. In this manner, the display system 1 causes the display device 3 to display the image Im that is obtained by overlapping the image in which the output signal path R of the portion to be inspected is emphasized, on the image of the circuit board 50.

Next, the emphasizing process according to the third embodiment will be described with reference to FIG. 6. FIG. 6 is a flowchart for explaining the emphasizing process according to the third embodiment.

In the display system 1, when the part number of the circuit board 50 and the portion to be inspected are supplied via the input device 2 (S200), and an image of the circuit board 50 is picked up by the image pick-up device 5 (S201), the inspection data output device 4 generates emphasis data (S202).

In the display system 1, the emphasis data generated by the inspection data output device 4 is output to the display device 3 (S203). Then, in the display system 1, the display device 3 then displays the image Im of the circuit board 50 in which the output signal path R of the portion to be inspected is emphasized (S204).

As described above, the inspection data output device 4 generates the data on the image Im in augmented reality in which the output signal path R of the portion to be inspected is emphasized, as emphasis data.

In this manner, the worker can easily specify the portion where the output signal of the portion to be inspected can be detected, on the basis of the image Im of the circuit board 50 that is displayed on the display device 3, and that is added with the image in which the output signal path R of the portion to be inspected is emphasized. Thus, the worker can easily perform the measurement work, and can accurately measure the output signal of the portion to be inspected.

The emphasis data generation unit 21 may also generate the data on the image Im in virtual reality that includes the circuit board 50 and the output signal path R of the portion to be inspected, and in which the output signal path R of the portion to be inspected is emphasized, as emphasis data. Hence, the same effects as those of the display system 1 according to the third embodiment can be obtained.

The display systems 1 according to the embodiments described above may also be combined. For example, the emphasis data generation unit 21 may also generate the emphasis data in which the output signal path R of the portion to be inspected is emphasized in the three-dimensional model of the circuit board 50, and the emphasis data of an image in which the output signal path R of the portion to be inspected is emphasized to be projected on the circuit board 50.

When the circuit board 50 has a multi-layer configuration, the emphasis data generation unit 21 of the inspection data output device 4 according to a modification may generate the emphasis data with different type of the output signal path R of the portion to be inspected for each layer. The emphasis data generation unit 21 according to the modification changes the line type, line color, and line thickness of the output signal path R of the portion to be inspected for each layer.

In this manner, the worker can easily specify the output signal path R of the portion to be inspected, even when the circuit board 50 has a multi-layer configuration.

When a signal output from the output signal path R of the portion to be inspected is supplied, the inspection data output device 4 according to the modification may determine whether the input signal is normal, on the basis of the input signal and the inspection signal. In other words, the inspection data output device 4 according to the modification may also function as an inspection device.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An inspection data output device, comprising:
   an input unit into which information on a portion to be inspected in an actual circuit board is supplied;
   a generation unit that generates emphasis data in which an output signal path is emphasized more than another signal path, the output signal path being a signal path on the circuit board, and being a signal path capable of detecting an output signal of the portion to be inspected; and
   an output unit that outputs the emphasis data to a display device, wherein
   the output signal path is emphasized on an image of the circuit board, and
   a position and shape of the signal path on the image of the circuit board are substantially matched with a position and shape of the signal path of the actual circuit board.

2. The inspection data output device according to claim 1, wherein
   the image of the circuit board is a model of the circuit board, and
   the generation unit generates emphasis data in which the output signal path in the model of the circuit board is emphasized.

3. The inspection data output device according to claim 1, wherein the generation unit generates, as emphasis data, data on an image that is projected on the circuit board and in which the output signal path is emphasized.

4. The inspection data output device according to claim 1, wherein the generation unit generates, as emphasis data, data on an image in augmented reality that is obtained by overlapping an image in which the output signal path is emphasized, on the image of the circuit board.

5. The inspection data output device according to claim 1, wherein the generation unit generates, as emphasis data, data on an image in virtual reality that includes the circuit board and the output signal path, and in which the output signal path is emphasized.

6. The inspection data output device according to claim 1, wherein the generation unit generates emphasis data in which only the output signal path is displayed among a plurality of the signal paths in the circuit board.

7. The inspection data output device according to claim 1, wherein the generation unit generates emphasis data with a different type of the output signal path for each layer, with respect to the circuit board having a multi-layer configuration.

8. The inspection data output device according to claim 1, wherein the generation unit generates emphasis data with a different type of the output signal path for each surface, with respect to the circuit board in which the signal path is formed on both sides.

9. A display system, comprising:
   the inspection data output device according to claim 1, and
   the display device that displays the image of the circuit board based on the emphasis data.

10. An inspection data output method, comprising:
    inputting information on a portion to be inspected in an actual circuit board;
    generating emphasis data in which an output signal path is emphasized more than another signal path, the output signal path being a signal path on the circuit board, and being a signal path capable of detecting an output signal of the portion to be inspected; and
    outputting the emphasis data to a display device, wherein
    the output signal path is emphasized on an image of the circuit board, and
    a position and shape of the signal path on the image of the circuit board are substantially matched with a position and shape of the signal path of the actual circuit board.

* * * * *